(12) United States Patent
Yamamiya

(10) Patent No.: US 7,928,358 B2
(45) Date of Patent: Apr. 19, 2011

(54) IMAGING DEVICE MODULE AND PORTABLE ELECTRONIC APPARATUS UTILIZING THE SAME

(75) Inventor: Kunio Yamamiya, Tokyo (JP)

(73) Assignee: Olympus Imaging Corp., Tokyo (JP)

( * ) Notice: Subject to any disclaimer, the term of this patent is extended or adjusted under 35 U.S.C. 154(b) by 74 days.

(21) Appl. No.: 12/025,188

(22) Filed: Feb. 4, 2008

(65) Prior Publication Data

US 2008/0192435 A1    Aug. 14, 2008

(30) Foreign Application Priority Data

Feb. 8, 2007    (JP) .................................. 2007-029337
Dec. 12, 2007    (JP) .................................. 2007-321138

(51) Int. Cl.
*H01J 40/14*    (2006.01)
*H01J 5/02*    (2006.01)

(52) U.S. Cl. ...................................................... 250/239

(58) Field of Classification Search .................. 250/238, 250/239
See application file for complete search history.

(56) References Cited

U.S. PATENT DOCUMENTS

2008/0049109 A1 *    2/2008    Teramoto et al. .......... 348/208.7

FOREIGN PATENT DOCUMENTS

| JP | 2-143152 | 6/1990 |
| JP | 2006-174226 | 6/2006 |
| JP | 2006-332894 | 12/2006 |

* cited by examiner

*Primary Examiner* — Seung C Sohn
(74) *Attorney, Agent, or Firm* — Volpe and Koenig P.C.

(57) ABSTRACT

In an imaging device module according to the invention, an opening is provided in an FPC board accommodated in an apparatus chassis. An insulating sheet of an imaging device is mounted opposite the opening on the FPC board. In a configuration of the imaging device module, a heat reflection member is thermally coupled to the insulating sheet, and a first radiation member thermally coupled to both the apparatus chassis and the imaging device is disposed so as to face the heat reflection member.

19 Claims, 11 Drawing Sheets

IMAGING DEVICE MODULE AND PORTABLE ELECTRONIC APPARATUS UTILIZING THE SAME

CROSS-REFERENCE TO RELATED APPLICATIONS

This application is based upon and claims the benefit of priority from prior Japanese Patent Applications No. 2007-029337, filed Feb. 8, 2007; and No. 2007-321138, filed Dec. 12, 2007, the entire contents of both of which are incorporated herein by reference.

BACKGROUND OF THE INVENTION

1. Field of the Invention

The present invention relates to a portable electronic apparatus including an electronic camera apparatus such as an imaging device-integrated lens interchangeable electronic camera apparatus and a camera head unit, and particularly to a cooling structure of the imaging device module.

2. Description of the Related Art

Generally, when an imaging device which is an electronic component and Central Processing Unit (CPU) constituting a control circuit are incorporated into this kind of portable electronic apparatus, there is a need for not only adopting thermal control but also ensuring dust control. As to the thermal control, when the dust control is improved, a temperature of the electronic component rises to increase a noise level, which causes image quality to be deteriorated in the case of the electronic camera apparatus. Therefore, recently the thermal control has become a large problem because of the increased performance of the imaging device or CPU.

For example, Jpn. Pat. Appln. KOKAI Publication Nos. 02-143152, 2006-332894, and 2006-174226 disclose a liquid-cooled radiation structure and an air-cooled radiation structure.

In the liquid-cooled radiation structure disclosed in Jpn. Pat. Appln. KOKAI Publication No. 02-143152, a cooling plate is brought into contact with a surface of an integrated circuit element mounted on a circuit board, and cooling water is supplied to a fine cooling medium flow passage to water-cool the cooling plate. A contact area is increased to obtain good thermal conductivity by disposing a thermal-conductive variable shape substance such as a compound having excellent thermal conductivity in a thermal coupling portion located between the cooling plate and the integrated circuit element.

Specifically, many integrated circuit elements are mounted on one surface side of a circuit board such as a ceramic plate. In a liquid cooling module disposed in the circuit board, the thermal-conductive variable shape substance such as the compound having excellent thermal conductivity is interposed between the surface of the integrated circuit element and the cooling plate to which the cooling medium is supplied through the cooling medium flow passage, and good thermal coupling is obtained between the cooling plate and the integrated circuit element by a spring force of a spring. Liquid supplying means includes a cooling medium supply pipe connected to the cooling medium passage, an on-off valve, and a mechanical pump.

Jpn. Pat. Appln. KOKAI Publication No. 2006-332894 discloses an air-cooled imaging apparatus including a body-side mount incorporated into a main body structure in a camera body to support an imaging lens, a shutter disposed along an optical axis in an opening of the main body structure, and an imaging unit. The imaging unit includes an imaging device fixing plate fixed to and supported by the main body structure, an optical lowpass filter, a protective glass, and a bear chip imaging device. In the imaging device, the imaging device fixing plate constituting a radiation plate is bonded and fixed to a surface on non-imaging surface side to ensure a distance in an optical axis direction from the surface of the body-side mount to the imaging surface (photoelectric conversion surface) of the imaging device. The heat generated by driving the imaging device is radiated through the imaging device fixing plate to suppress the temperature rise.

Jpn. Pat. Appln. KOKAI Publication No. 2006-174226 discloses an imaging device swing-type imaging unit with an image stabilizing function, wherein the imaging device including a package, a lead terminal, and a cover glass is mounted on a circuit board, and an opening provided in the circuit board abuts on a heat absorbing surface of a cooling element such as a Peltier element while a flexible sheet is disposed in the backside of the package. A small radiation member is disposed between the backside of the package and the heat absorbing surface of the cooling element, a large radiation member is disposed on a chassis side, and the small radiation member and the large radiation member are thermally coupled by a heat transfer member.

BRIEF SUMMARY OF THE INVENTION

An object of the invention is to provide an imaging device module in which high-efficiency heat transfer is realized with a simple structure to enhance cooling efficiency and a degree of freedom of production including design is improved, and a portable electronic apparatus utilizing the same.

The present invention provides an imaging device module comprising:

a printed circuit board which is accommodated in an apparatus chassis and provided with an opening;

an imaging device which is mounted on the printed circuit board while an insulating sheet faces the opening in the printed circuit board;

an infrared reflection member which is disposed while thermally coupled to a backside of the imaging device, and reflects an infrared ray emitted from a radiation plate; and a radiation member which is thermally coupled to the apparatus chassis and disposed opposite the infrared reflection member.

The present invention further provides an imaging device module comprising:

an imaging device which is disposed while an insulating sheet is exposed to a surface side opposite to a mounting surface;

a flexible printed circuit board which is accommodated in an apparatus chassis, an electronic component including the imaging device being mounted on the flexible printed circuit board;

a radiation member which is thermally coupled to the apparatus chassis, and partially supports a backside of the flexible printed circuit board in a neighborhood of the imaging device while thermally coupled to the insulating sheet of the imaging device;

a thermal conductive material which is encapsulated in the radiation member and has excellent thermal conductivity compared with the radiation member; and a support member which is thermally coupled to the radiation member, and partially supports the backside of the flexible printed circuit board in a neighborhood of the electronic component.

The present invention further provides a portable electronic apparatus in which an imaging device module is used, the portable electronic apparatus comprising:

an apparatus chassis; and an imaging device module which is disposed and accommodated in the apparatus chassis, a package-type imaging device being mounted on a printed circuit board in the imaging device module, a heat acceptance portion being disposed while thermally coupled to a backside of the imaging device in the imaging device module, a radiation member being disposed opposite the heat acceptance portion in the imaging device module while being thermally coupled to the apparatus chassis.

The present invention further provides a portable electronic apparatus in which an imaging device module is used, the portable electronic apparatus comprising:

an apparatus chassis; and an imaging device module which is disposed and accommodated in the apparatus chassis, an electronic component including an imaging device being mounted on a flexible printed circuit board in the imaging device module, the imaging device being disposed while an insulating sheet is exposed to a surface side opposite to a mounting surface, a radiation member which is thermally coupled to the apparatus chassis being thermally coupled to the insulating sheet of the imaging device while abutting on the insulating sheet, a thermal conductive material having excellent thermal conductivity being encapsulated in the radiation member, the radiation member partially supporting a backside of the flexible printed circuit board in a neighborhood of the imaging device, the radiation member partially supporting the backside of the flexible printed circuit board in a neighborhood of the electronic component while a support member thermally coupled to the radiation member is interposed.

According to the invention, the heat of the imaging device mounted on the printed circuit board is transferred from the insulating sheet to the infrared reflection member, and the heat is transferred in the form of the infrared ray from the infrared reflection member to the radiation member disposed on the opposite side to the surface in which the printed circuit board is mounted, while the heat is directly transferred by the thermal conduction. Therefore, because the heat of the imaging device can efficiently be transferred to the radiation member, the high-efficiency cooling can be realized and the degree of freedom of the production including the design is improved.

According to the invention, when the heat of the imaging device mounted on the printed circuit board is transferred from the insulating sheet to the radiation member disposed on the opposite side to the surface in which the printed circuit board is mounted, the heat is efficiently conducted to the entire radiation member by the thermal conductive material. Therefore, because the heat of the imaging device can efficiently be transferred to the radiation member, the high-efficiency cooling can be realized and the degree of freedom of the production including the design is improved.

According to the invention, the heat of the imaging device mounted on the printed circuit board is transferred from the infrared heat reflection member disposed in the backside of the imaging device to the radiation member disposed on the opposite side to the surface in which the printed circuit board is mounted by the thermal conduction and the radiation. Therefore, because the heat of the imaging device can efficiently be transferred to the radiation member, the high-efficiency cooling can be realized, the degree of freedom of the production including the design is improved, and the compact apparatus chassis suitable to the portable use can be realized.

According to the invention, when the heat of the imaging device mounted on the printed circuit board is transferred from the insulating sheet to the radiation member disposed on the opposite side to the surface in which the printed circuit board is mounted, the heat is efficiently conducted to the entire radiation member by the thermal conductive material. Therefore, because the heat of the imaging device can efficiently be transferred to the radiation member, the high-efficiency cooling can be realized and the degree of freedom of the production including the design is improved, and the compact apparatus chassis suitable to the portable use can be realized.

Advantages of the invention will be set forth in the description which follows, and in part will be obvious from the description, or may be learned by practice of the invention. Advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An imaging device module according to a first embodiment of the invention and a portable electronic apparatus utilizing the same will be described in detail with reference to the drawings.

First Embodiment

The imaging device module of the first embodiment will be described below.

Figure 1A:
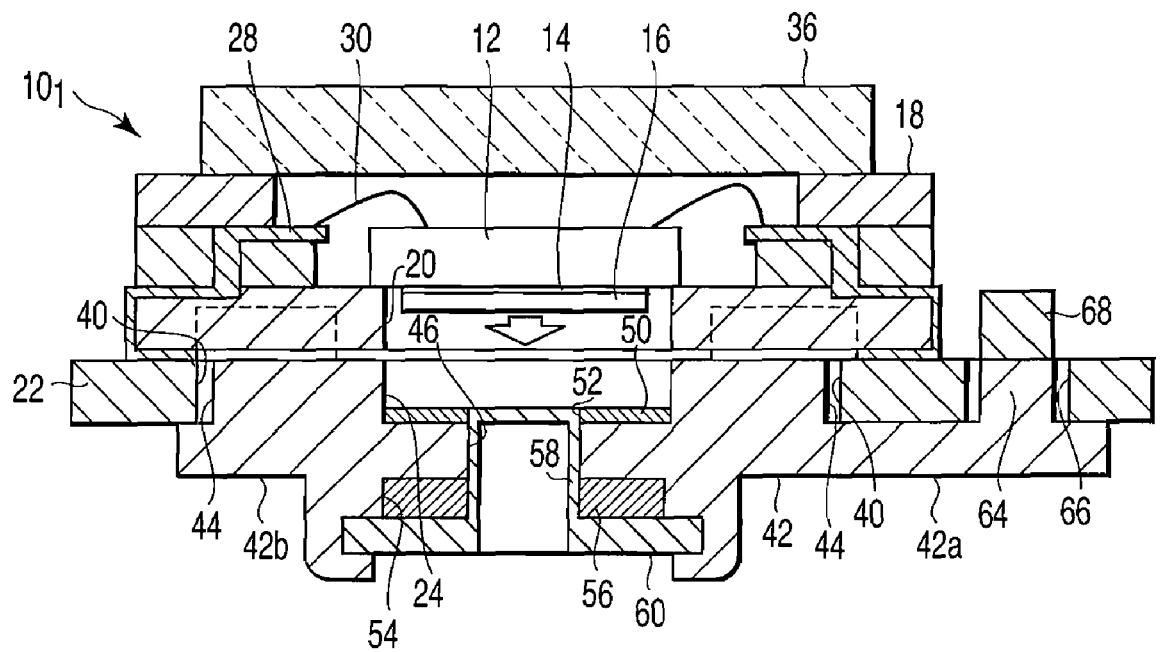
FIG. 1A is a sectional view showing an imaging device module according to a first embodiment of the invention.

FIG. 1A shows an imaging device module $10_1$ of the first embodiment. Referring to FIG. 1A, in an imaging device 12, a heat reflection member (low-radiation sheet) 16 which is an infrared reflection member is jointed to an insulating sheet 14 in a backside of the imaging device 12, and, for example, the imaging device 12 and the heat reflection member 16 are accommodated and disposed in a ceramic package main body 18. For example, the heat reflection member 16 is made of an aluminum material with mirror finish (emissivity of 0.1 or less). A processed surface having emissivity of 0.1 to 0.6 and infrared reflectance of 75 to 90% is formed by coating a surface of the heat reflection member 16 with metal foil, metal oxide, or infrared cut filter (high infrared reflectance) or by applying a white coating compound (low-emissivity coating compound) to a resin sheet. Therefore, when the heat is transferred from the imaging device 12 to an radiation plate, the heat reflection member 16 shields an infrared ray emitted from the outside (for example, radiation plate) and blocks incidence of the infrared ray.

The radiation plate and the heat reflection member (low-emissivity resin sheet) can radiate the heat of the radiation plate to a space (gap near imaging device) while suppressing temperature re-rise of the imaging device. The surface of the radiation plate is coated with a high-emissivity coating compound such as a black coating compound, zirconia ceramics, and ceramic-containing material. The heat reflection member reflects the infrared ray from the radiation plate.

In the package main body 18, a radiating opening 20 is provided opposite the heat reflection member 16. The opening 20 of the package main body 18 faces a radiating opening 24 provided in a flexible printed circuit board (hereinafter referred to as FPC board) 22 which can elastically be deformed, and the package main body 18 is mounted on and thermally coupled to the FPC board 22.

Figure 2:
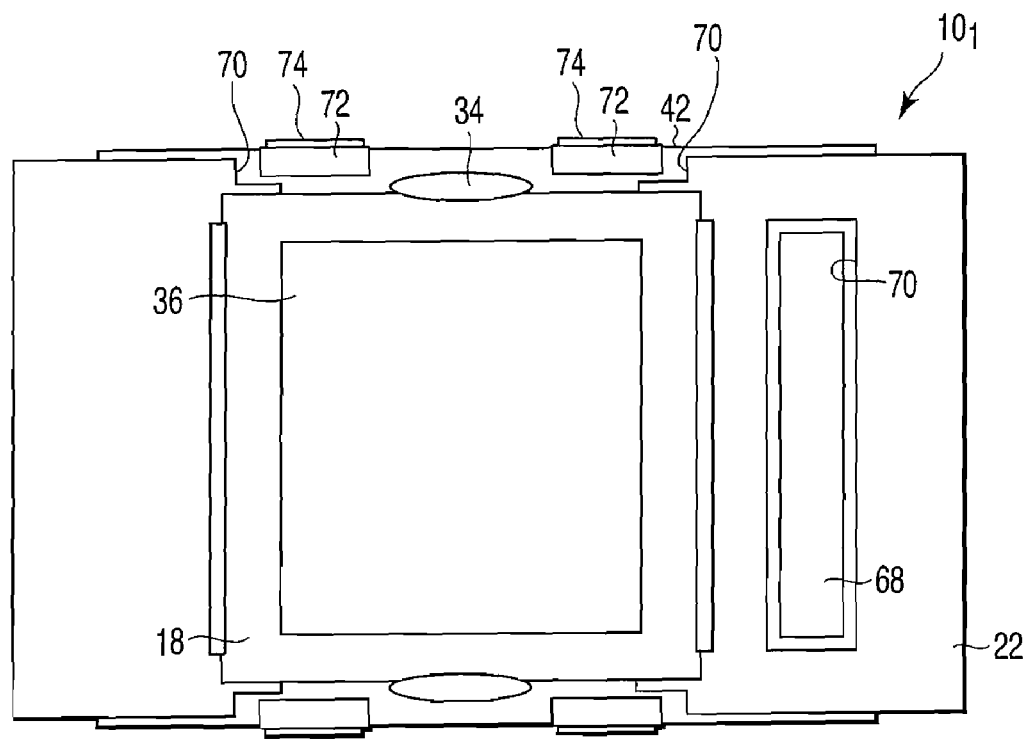
FIG. 2 is a plan view showing the imaging device module of FIG. 1A when viewed from light acceptance surface side.

A lead terminal 28 of the package main body 18 is connected to an electrode of the imaging device 12 by bonding 30. The lead terminal 28 is drawn to the outside and connected to a wiring pattern of the FPC board 22. As shown in FIG. 2, both side portions orthogonal to the side portions in which the lead terminals 28 electrically connected to the imaging device 12 are disposed are thermally coupled to the FPC board 22 while bonded to the FPC board 22 using a bonding agent 34 having excellent thermal conductivity. A protective glass 36 adheres to an upper surface portion of the package main body 18 to accommodate the imaging device 12 in an airtight manner.

In the FPC board 22, board end portions 40 are provided while sandwiching the opening 24 therebetween. In the board end portion 40, projections 44 are provided in a first radiation member 42 constituting a radiation member. The projections 44 are coupled to the package main body 18 while facing the package main body 18. The first radiation member 42 is made of a metal material such as a copper or aluminum alloy, and an opening 46 is provided opposite the opening 24 of the FPC board 22 in a substantially central portion of the first radiation member 42. The package main body 18 is positioned and supported by the first radiation member 42.

In the first radiation member 42, a high-radiation sheet 50 which is an infrared absorbing member is provided so as to be located in a recess 24 of the radiation member 42. The high-radiation sheet 50 is made of an aluminum material. A black alumite treatment, spline forming, a grain treatment, or the like is performed to a surface of the high-radiation sheet 50 to form orderly or random irregularity such that the surface does not reflect the infrared ray, thereby forming the treated surface having the emissivity of 0.9 or more, the low infrared reflectance, and the high heat absorbance property. The protrusion 46 of a second radiation member 60 is inserted into an opening 52 provided in the high-radiation sheet 50. Therefore, the high-radiation sheet 50 efficiently absorbs the infrared ray from the outside or the heat reflection member 16 to suppress the infrared radiation to the heat reflection member to the minimum.

The radiation efficiency is improved when a small opening is formed in an upper surface of the protrusion 46 to directly radiate the heat accumulated between the heat reflection member 16 and the high-radiation sheet 50 to outside.

The high-radiation sheet 50 may directly be formed with the first radiation member 42 by performing the surface treatment to a region facing the heat reflection member 16 of the first radiation member 42.

In the first radiation member 42, a recess 54 is formed on the backside of the high-radiation sheet 50. The protrusion 46 and the second radiation member 60 having a hollow projection 58 are press-bonded to the recess 54 by caulking while a thermal conductive material 56 is interposed, thereby integrally assembling to the first radiation member 42. The second radiation member 60 is made of the same material as the first radiation member 42. The thermal conductive material 56 is made of a material, such as a graphite carbon material, silicon gel, metal foaming material, various porous polycrystalline materials, and a graphite sheet, which has the thermal conductivity higher than those of the first and second radiation members 42 and 60.

Therefore, the heat from the heat reflection member 16 is discharged to the outside from the opening 52 of the high-radiation sheet 50 through the protrusion 46 of the second radiation member 60, and so-called stagnation of the heat can be eliminated to prevent thermal saturation of the imaging device 12. However, the opening 52 may not necessarily be formed in the high-radiation sheet 50, but the upper surface of the protrusion 46 of the second radiation member 60 may be thermally connected directly to the high-radiation sheet 50.

Instead of the thermal conductive body, a resin sheet may be made of a phase-change latent heat accumulation material, e.g., an organic material in which a microcapsule paraffin material is filled with carbon fiber. When a phase-change temperature of the latent heat accumulation material is set in a range of 40 to 50° C., a rapid increase in temperature can be suppressed in the apparatus, and abnormal temperature detection with a temperature sensor can be delayed to improve user friendliness.

The lower surface 42a, 42b of the radiation member 42 is formed in flat (caulking is not required), and the resin sheet made of the organic material in which the microcapsule-type paraffin material is filled with the carbon fiber is coupled to the radiation member 42, which simplifies the structure of the radiation member 42 to facilitate assembly.

A chassis coupling portion 64 is provided in the first radiation member 42. The chassis coupling portion 64 is inserted in an insertion hole 66 made in the FPC board 22 and thermally coupled to an apparatus chassis 68. Therefore, the first radiation member 42 transfers part of the transferred heat to the apparatus chassis 68, and the heat is released from the apparatus chassis 68 to suppress the temperature rise of the imaging device 12.

Four notches 70 are provided in the FPC board 22 while the bonding agent 34, which is the bonding portion with the package main body 18, is interposed between the notches 70 (see FIG. 2). A heat acceptance portion 72 vertically provided in the first radiation member 42 is inserted in the notch 70. The heat acceptance portion 72 accepts the heat radiated from a surrounding wall of the package main body 18 independently of the high-radiation sheet 50. Further, the heat acceptance portion 72 has a high-radiation sheet 74 to absorb infrared rays.

In the configuration, when the imaging device 12 is driven to generate heat, the heat is transferred from the package main body 18 and FPC board 22 to the first radiation member 42 by the thermal conduction. At the same time, the heat from other electronic components on the FPC board 22 is transferred to the first radiation member 42 through the FPC board 22 by the thermal conduction.

Desirably a part of the package main body 18 is closed by the bonding agent 34 such that the heat released from the gap between the lower surface of the package main body 18 and the first radiation member 42 is not transferred to the FPC board.

The heat generated in the imaging device 12 is directly transferred to the heat reflection member 16 through the insulating sheet 14, the heat is emitted in the form of the infrared ray in the heat reflection member 16, and the heat in the form of the infrared ray is transferred to the first radiation member 42 through the high-radiation sheet 50. Part of the heat from the imaging device 12 is radiated from the sidewall of the package main body 18. The heat released from the sidewall of the package main body 18 is transferred to a heat acceptance portion 72 of the first radiation member 42 by heat radiation and convection and transferred to the first radiation member 42.

Thus, the heat transferred in the three modes (heat conduction, radiation and convection) to the first radiation member 42 is transferred to the second radiation member 60 through the thermal conductive material 56. The heat is efficiently conducted as a whole, and is transferred to the apparatus chassis 68 by the chassis coupling portion 64 and radiated to the outside. Therefore, the imaging device 12 is cooled to suppress the temperature to a desired level. At this point, the heat is also discharged from other electronic components mounted on the FPC board 22 to cool the electronic components.

Thus, in the imaging device module $10_1$, the opening 24 is provided in the FPC board 22 accommodated in the apparatus chassis 68, and the insulating sheet 14 of the imaging device 12 is mounted on the FPC board 22 while facing the opening 24. The heat reflection member 16 is thermally coupled to the insulating sheet 14, and the first radiation member 42 thermally coupled to both the apparatus chassis 68 and the imaging device 12 is disposed opposite the heat reflection member 16.

At this point, in the heat reflection member, the insulating sheet 14 can be omitted when the resin sheet to which the low-radiation sheet adheres is used.

In this case, the heat of the imaging device 12 soldered to the FPC board 22 is transferred from the insulating sheet 14 to the heat reflection member 16. Then, part of the transferred heat is transferred in the form of the infrared ray from the heat reflection member 16 to the high-radiation sheet 50 or the inside of the protrusion 46. The high-radiation sheet 50 is coupled to the first radiation member 42 disposed on the opposite side of the soldering surface of the FPC board 22. The heat conducted to the heat reflection member 16 is conducted from the package main body 18 to the FPC board 22 or heat acceptance portion 72, and is conducted to the first radiation member 42.

Figure 1B:
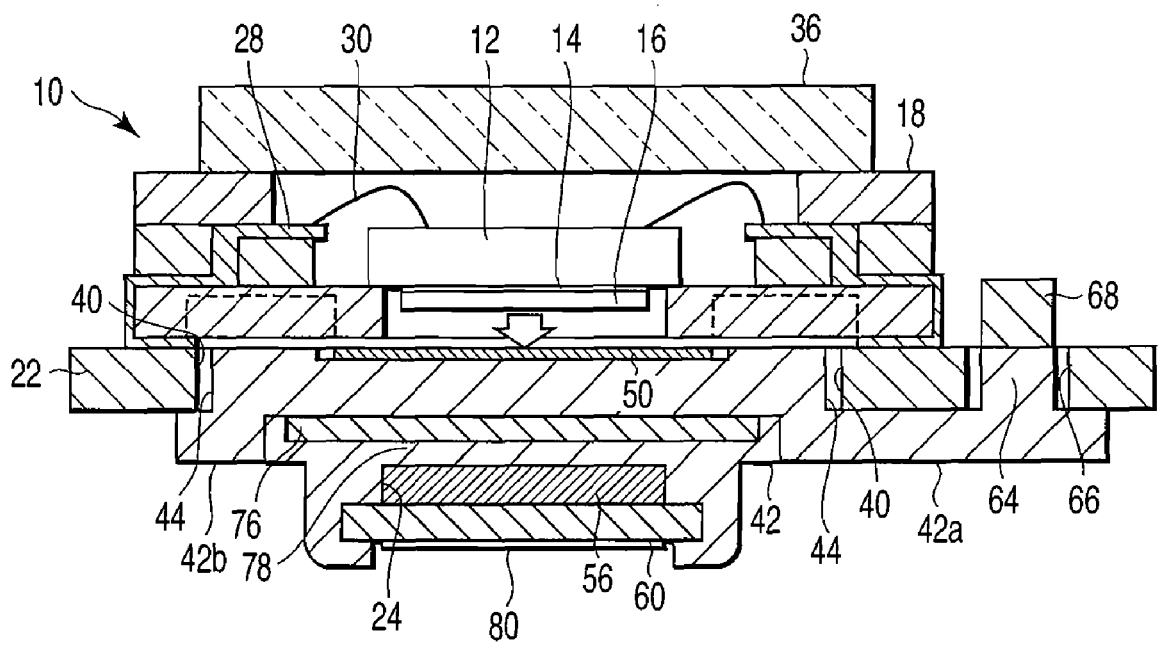
FIG. 1B is a sectional view showing another configuration example of the imaging device module according to the first embodiment of the invention.

FIG. 1B is a sectional view showing another configuration example of the imaging device module according to the first embodiment of the invention.

The configuration of FIG. 1B differs from the configuration of FIG. 1A in that the protrusion 46 is not provided while a thermal conductive material 76, third radiation member 78, the thermal conductive material 56, the second radiation member 60, and a radiation sheet 80 are provided in a laminated manner in the first radiation member 42. The radiation sheet 80 is formed by applying a ceramic-containing material to the surface of the second radiation member 60, and the radiation sheet 80 is provided to release the radiated heat.

The first radiation member 42 is divided into the two components, the thermal conductive material 76 is interposed in a boundary portion between the two components, and the radiation sheet 80 adheres to the surface, so that the higher radiation efficiency can be obtained to downsize the radiation plate.

Although the package-type imaging device has been described in the embodiment, the package-type imaging device can be replaced by a bare chip imaging device.

Use of the imaging device module will be described below. In this case, the imaging device module 10 having the configuration shown in FIG. 1B will be described by way of example.

Figure 3:
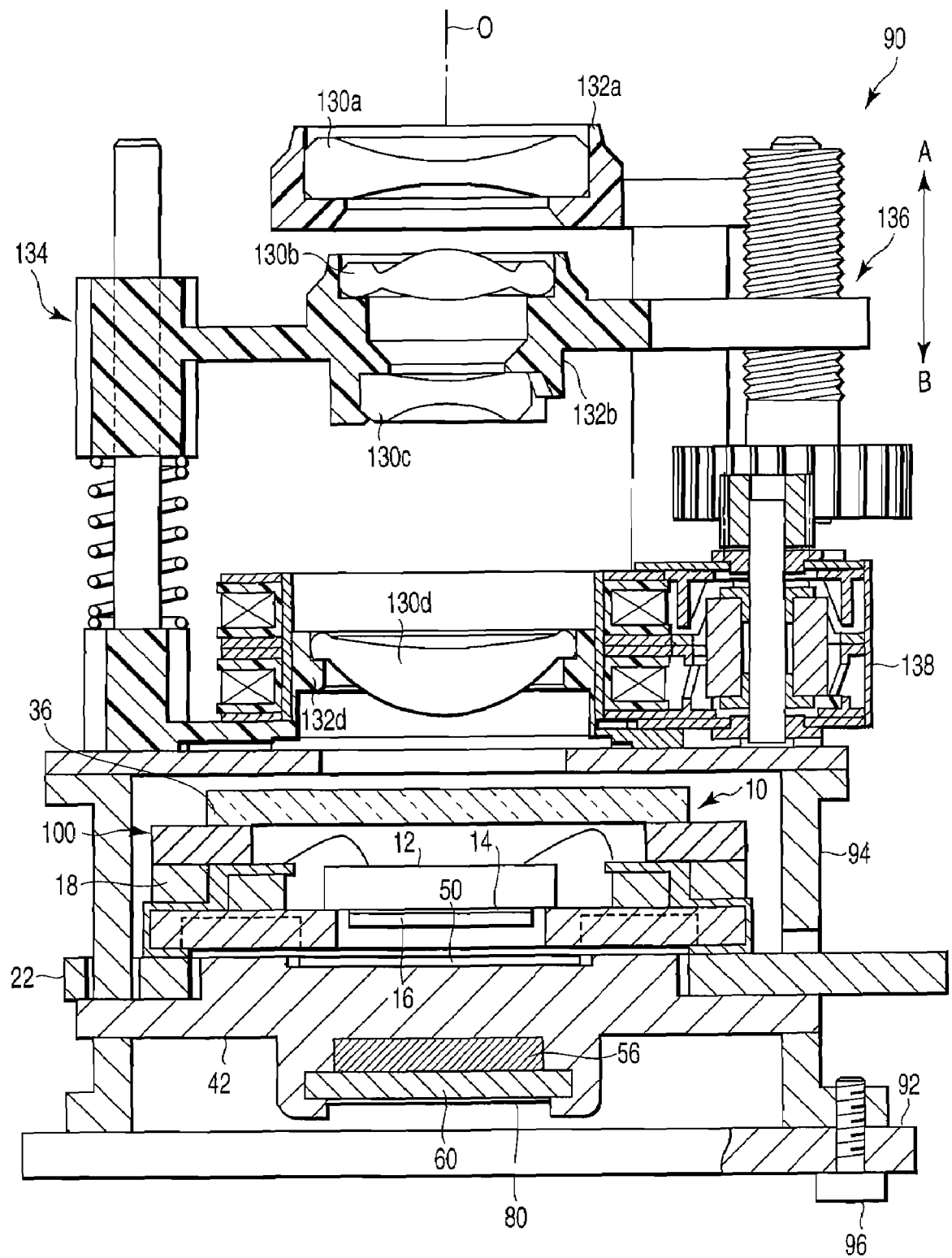
FIG. 3 is a sectional view for explaining a camera unit in which the imaging device module of FIG. 1B is used.

For example, as shown in FIG. 3, the imaging device module 10 is used while assembled between a lens unit 90 and a camera main body 92 of an electronic camera which is the portable electronic apparatus. In FIG. 3, the same components as those of FIGS. 1B and 2 are designated by the same numerals, and detailed description thereof is omitted.

Figure 4:
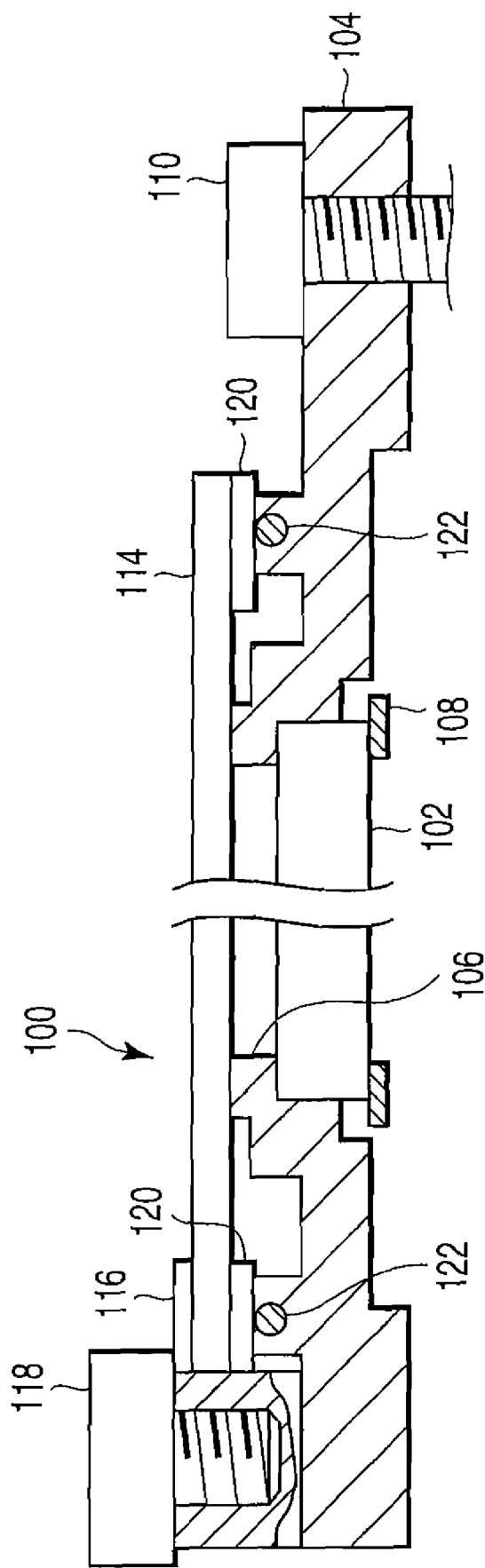
FIG. 4 is a sectional view showing a dust-proof mechanism incorporated into the camera unit of FIG. 3.

That is, the imaging device module 10 is accommodated in a unit connecting ring 94, and the first radiation member 42 of the imaging device module 10 is thermally coupled to the unit connecting ring 94. In the unit connecting ring 94, a base end is fixed to the camera main body 92 using a screw member 96. A dust-proof mechanism 100 shown in FIG. 4 is assembled to the upper surface of the imaging device module 10.

In the dust-proof mechanism 100, a lowpass filter 102 is provided so as to close an opening 106 made in an attaching member 104. The lowpass filter 102 is disposed in the upper surface of the imaging device 12 while a ring rubber support plate 108 is interposed. In the state in which the lowpass filter 102 is disposed on the imaging device 12 while the support plate 108 is interposed, the attaching member 104 is fixed to the apparatus chassis 68 (not shown) using a screw member 110. This can prevent the dust from invading into the surface of the protective glass 36 of the package main body 18.

In the attaching member 104, a dust-proof transparent glass board 114 is disposed opposite the lowpass filter 102 with a predetermined distance. Using a screw member 118, the transparent glass board 114 is assembled with desired air tightness while an elastic member 116 is interposed. A vibration generating member 120 such as a piezoelectric element and a ring rubber member 122 (in this case, although the rubber member 122 is formed by an O-ring, it may be formed in the same width as the vibration generating member 120) which prevent the dust from invading into the surface of the lowpass filter 102 are interposed between the transparent glass board 114 and the attaching member 104.

The transparent glass board 114 is disposed opposite the lowpass filter 102 in the air-tight manner while being able to be vibrated. The vibration is transmitted, when the vibration generating member 120 is driven and vibrated through a drive control portion (not shown). The transparent glass board 114 is vibrated while keeping the air tightness against an elastic force of the elastic member 116, and the dust adhering to the surface of the transparent glass board 114 is removed to prevent the dust from invading into the lowpass filter 102.

Referring to FIG. 3, the lens unit 90 is assembled to a front end portion of the unit connecting ring 94. An imaging lens system is accommodated and disposed in the lens unit 90. For example, the imaging lens system is formed by 4 elements in 3 groups, i.e., a first-group first lens 130a, second-group second and third lenses 130b and 130c, and a third-group fourth lens 130d. The lens unit 90 moves the second-group second and third lenses 130b and 130c in the direction of an optical axis O to adjust a focal point.

The first lens 130a and the fourth lens 130d are accommodated in holders 132a and 132d, respectively, and are positioned and fixed onto the optical axis O by the holders 132a and 132d. The second and third lenses 130b and 130c are accommodated in a holder 132b. The holder 132b is supported by a guide mechanism 134 having an anti-rattling structure while being movable in arrow directions A and B of FIG. 3 along the optical axis O.

The holder 132b is coupled to a linear screw mechanism 136 while being linearly movable in the arrow directions A and B of FIG. 3 along the optical axis O. The linear screw mechanism 136 is coupled to a stepping motor 138 while being able to be driven, and is rotated in conjunction with the drive of the stepping motor 138. Therefore, the holder 132a is linearly moved in the arrow directions A and B. At this point, the holder 132b is guided and moved in the arrow directions A and B by the guide mechanism 134, whereby the second and third lenses 130b and 130c are moved in the optical axis to adjust the focal point.

Thus, the degree of freedom of the production including the thermal design is improved while the high-efficiency cooling is realized by assembling the imaging device module 10 to the lens unit 90 of the electronic camera, so that the compact camera main body 92 can be realized.

In the first embodiment, the imaging device module and portable electronic apparatus are configured using the elastically-deformable FPC board 22. The invention is not limited to the elastically-deformable FPC board 22, but the imaging device module and portable electronic apparatus can be configured using a rigid printed circuit board. In this case, a similar effect can be obtained.

The invention is not limited to the first embodiment. Alternatively, for example, imaging device modules 10a to 10f may be configured as shown in FIGS. 5 to 11, and the similar effect can be obtained. In FIGS. 5 to 11, the same components as those of FIGS. 1A, 1B, and 2 are designated by the same reference numerals, and the detailed description thereof is omitted.

Figure 5:
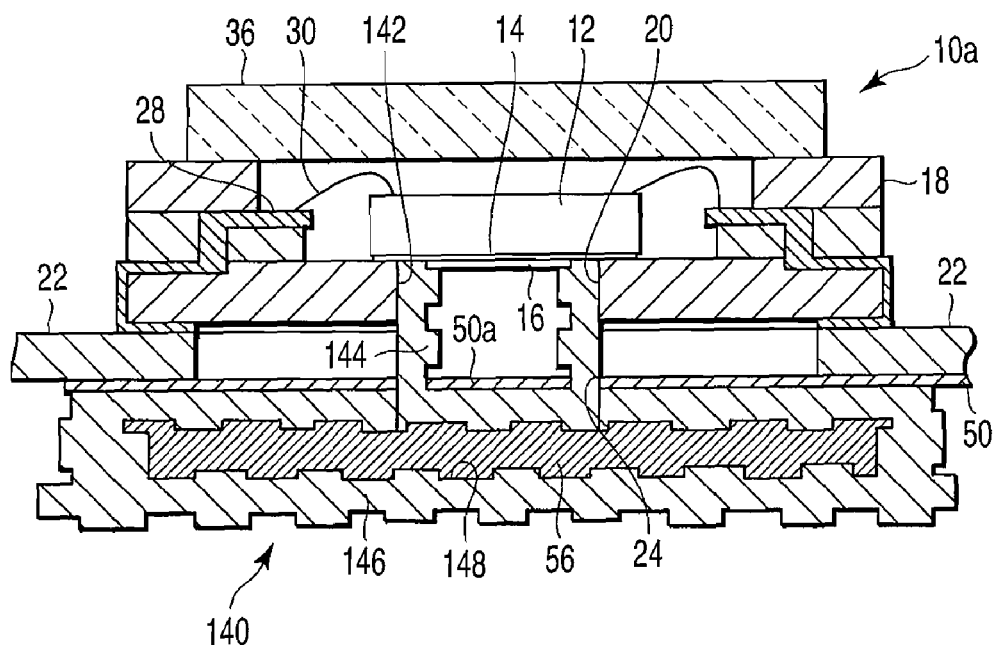
FIG. 5 is a sectional view showing another example of the imaging device module according to the first embodiment of the invention.

In the imaging device module 10a shown in FIG. 5, the invention is applied to a package type in which the imaging device 12 is accommodated in the package main body 18.

Referring to FIG. 5, in the imaging device module 10a, the opening 20 corresponding to the insulating sheet 14 of the imaging device 12 is formed in a bottom surface of the package main body 18. The heat reflection member 16 is disposed in the opening 20. The heat reflection member 16 is the infrared reflection member coupled to the insulating sheet 14 of the imaging device 12.

In the FPC board 22 on which the imaging device 12 is mounted, the opening 24 is formed subsequent to the opening 20 of the package main body 18. A recessed first heat coupling portion 142 provided in one end portion of a metal radiation member 140 made of an aluminum alloy is inserted into the opening 20 of the package main body 18 and the opening 24 of the FPC board 22. A front end portion of the first heat coupling portion 142 is thermally coupled to the insulating sheet 14 of the imaging device 12.

Radiation fins 144 are formed on an inner wall of the first heat coupling portion 142 of the radiation member 140, and a high-radiation sheet 50a is disposed opposite the heat reflection member 16 in a bottom surface of the first heat coupling portion 142. At the same time, the high-radiation sheet 50 is disposed while extended along the FPC board 22. Therefore, the high-radiation sheet 50a accepts the infrared ray radiated from the heat reflection member 16 to transfer the infrared ray to the first heat coupling portion 142.

A wide second heat coupling portion 146 is detachably provided in the first heat coupling portion 142. In the second heat coupling portion 146, the wide portion is thermally coupled to the backside of the FPC board 22.

A hollow portion 148 in which radiation fins are projected from the inner and outer walls is provided in the second heat coupling portion 146. The inorganic or organic latent heat accumulation material and the thermal conductive material 56 such as the graphite carbon material, silicon gel, metal foaming material, various porous polycrystalline materials, and graphite sheet having the excellent thermal conductivity are accommodated in the airtight manner in the hollow portion 148. Therefore, the radiation member 140 ensures the sufficient heat radiating area. When the heat is transferred to the first heat coupling portion 142, the heat can be conducted to the whole including the second heat coupling portion 146 through the thermal conductive material 56 to realize the high-efficient heat radiation.

Figure 6:
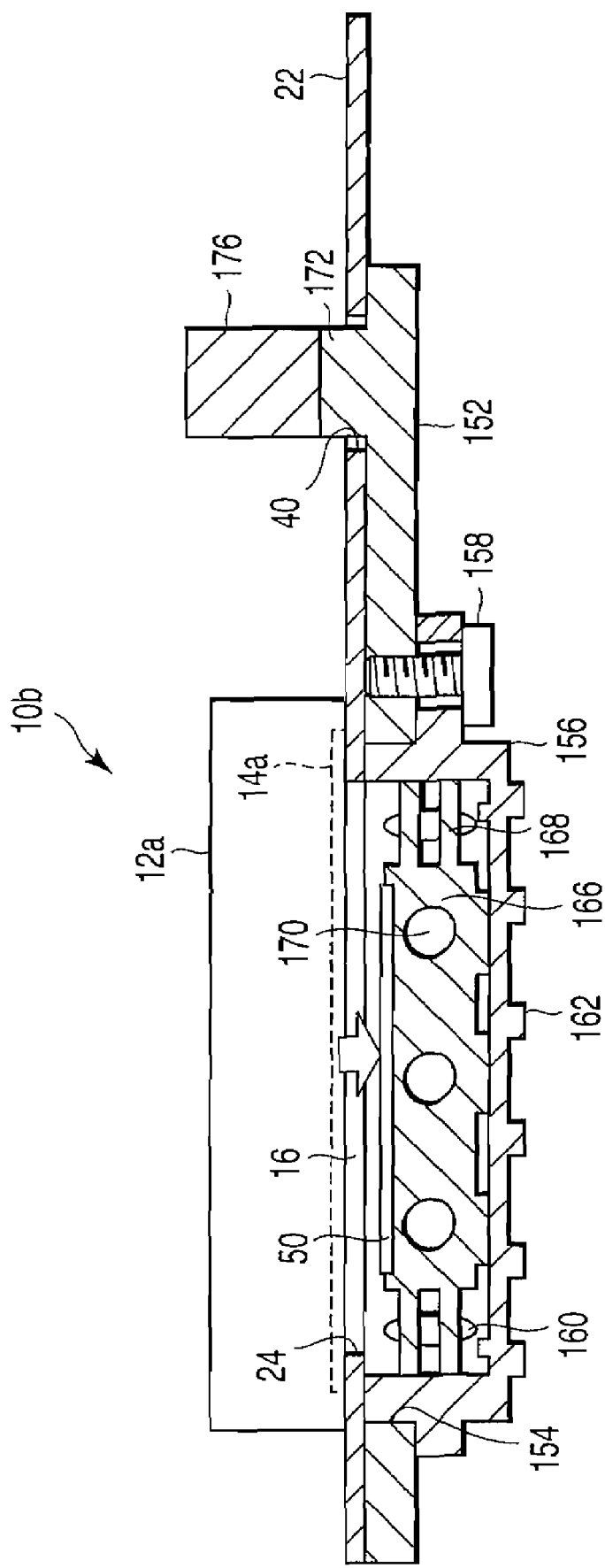
FIG. 6 is a sectional view showing another example of the imaging device module according to the first embodiment of the invention.

The imaging device module 10b shown in FIG. 6 is configured using a so-called bear chip imaging device 12a.

Referring to FIG. 6, the opening 24 corresponding to the insulating sheet 14a of the imaging device 12a is formed in the FPC board 22. The heat reflection member 16 which is the infrared reflection member is disposed in the opening 24 while coupled to the insulating sheet 14a of the imaging device 12a.

A first radiation member 152 constituting the support member is disposed in the backside of the FPC board 22 on which the imaging device 12a is mounted, and the first radiation member 152 is thermally coupled to the FPC board 22. An opening 154 is formed opposite the heat reflection member 16 in the first radiation member 152. A recessed second radiation member 156 made of a metal material such as copper is fixed to the opening 154 with a screw member 158 while facing the heat reflection member 16.

A vent hole 160 is provided in a sidewall of the second radiation member 156, and radiation fins 162 are formed on an outer wall of a bottom surface of the second radiation member 156. Therefore, the second radiation member 156 can efficiently discharge the heat transferred through the vent hole 160 and radiation fins 162 to the outside.

A metal third radiation member 166 is bonded to the inside of the second radiation member 156 using an ultraviolet curing bonding agent. Radiation fins 168 are provided on a surrounding wall of the third radiation member 166, and front end portions of the radiation fins 168 are thermally coupled to the inner wall of the second radiation member 156. A vent hole 170 corresponding to the vent hole 160 of the second radiation member 156 is provided in the third radiation member 166. The heat transferred through the vent hole 170 can efficiently be discharged to the outside.

A protrusion 172 is provided in the first radiation member 152. The protrusion 172 is inserted into the insertion hole 40 of the FPC board 22 to thermally couple the first radiation member 152 to an apparatus chassis 176. Therefore, the first radiation member 152 can discharge the heat transferred through the imaging device 12a and FPC board 22 to the apparatus chassis 176.

The first to third radiation members 152, 156, and 166 are made of the same metal material.

Figure 7:
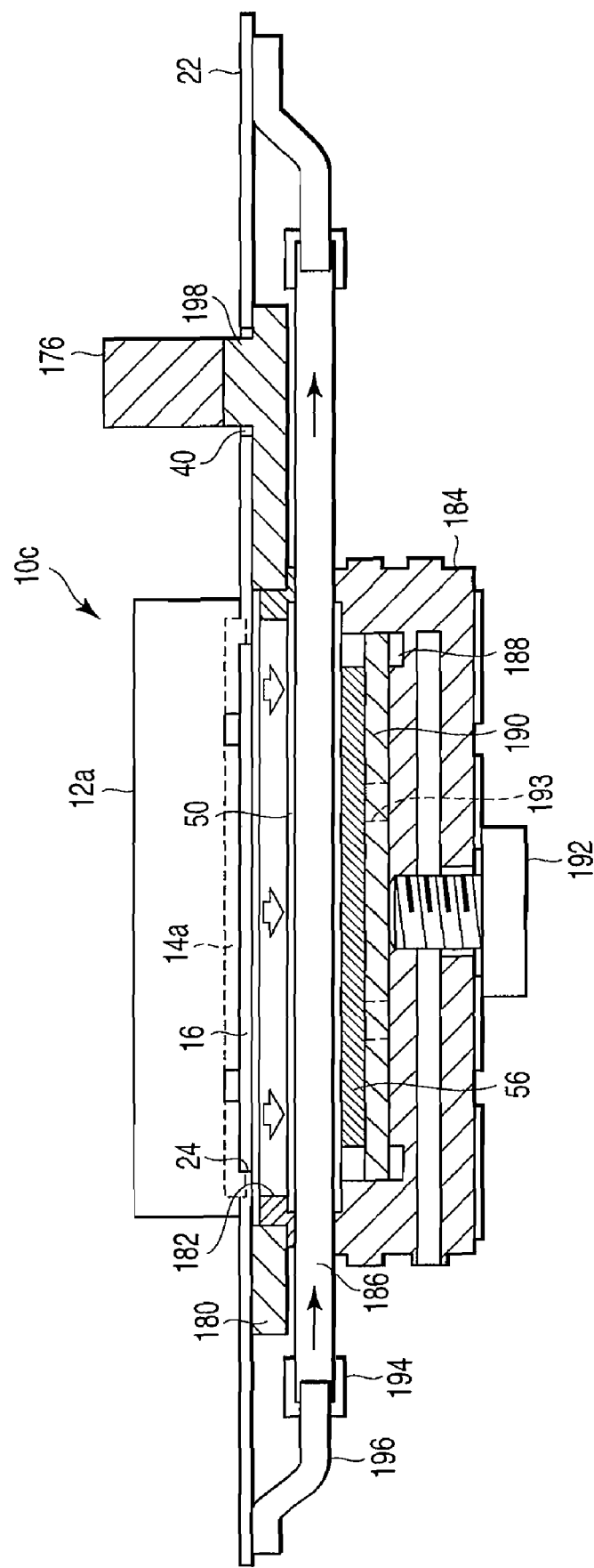
FIG. 7 is a sectional view showing another example of the imaging device module according to the first embodiment of the invention.

The imaging device module 10c shown in FIG. 7 is applied to a single-lens reflex digital camera with image stabilizing correction. Accordingly, the imaging device is supported by a camera main body while being able to be displaced on an XY-plane orthogonal to the optical axis of the imaging lens, and is driven in the XY-plane when taking the image according to the image stabilizing state by the image stabilizing mechanism (for example, a linear motor including a driving coil and a permanent magnet, electromagnetic drive including a stepping motor and screw shaft, and a linear motor in which a piezoelectric element or a bending vibrator is used).

Referring to FIG. 7, the imaging device module 10c is formed by the bear chip imaging device 12a, and the imaging device 12a is mounted opposite the board surface on the FPC board 22. In the FPC board 22, the opening 24 is provided opposite the insulating sheet 14a. The heat reflection member 16 is coupled to the opening 24.

The FPC board 22 is laminated on a first radiation member 180 made of a metal material, and is disposed while supported by the first radiation member 180. An opening 182 is formed in the first radiation member 180 while facing the opening 24 of the FPC board 22. A front end portion of a recessed second radiation member 184 made of a metal material is attached to the opening 182 of the first radiation member 180 while thermally coupled to the first radiation member 180.

A well-known plate-shape metal pipe 186 which is a kind of heat pipe, i.e., a so-called wick pipe is thermally coupled to an intermediate portion of the second radiation member 184, and the second radiation member 184 is closed by the metal pipe 186. In one surface of the metal pipe 186, the high-radiation sheet 50 is disposed opposite the heat reflection member 16, and the high-radiation sheet 50 has the processed surface having the low infrared reflectance and high heat absorbing property.

A guide groove 188 is provided in the inner wall of the second radiation member 184. A metal plate 190 made of a metal material such as copper is movably attached between the guide groove 188 and the metal pipe 186 while the thermal conductive material 56 such as the silicon gel and graphite sheet material is interposed. In the metal plate 190, a front end portion of an adjustment screw member 192 engages a bottom portion of the second radiation member 184, and the adjustment screw member 192 is provided in screw adjustable manner. The metal plate 190 is vertically adjusted by screw-adjusting the adjustment screw member 192, and is brought into press-contact with the metal pipe 186 while the thermal conductive material 56 is interposed.

At this point, the thermal conductive material 56 is disposed between the metal pipe 186 and the metal plate 190 while air in the thermal conductive material 56 is released from a vent hole 193 made in the metal plate 190. Therefore, the heat can efficiently be conducted between the metal pipe 186 and the second radiation member 184 through the thermal conductive material 56 and metal plate 190.

The metal pipe 186 is connected to a flexible synthetic resin pipe 196 constituting a circular path through a connection pipe 194. A condenser and a piezoelectric pump, disposed in a chassis on the apparatus main body side (not shown), are sequentially connected to the flexible synthetic resin pipe 196. Using the heat pipe with the wick or the piezoelectric pump, a working fluid such as pure water, alcohol, and a phase-change medium is circularly supplied to the metal pipe 186 and the condenser to discharge the heat transferred from the imaging device. In this case, the working fluid having an optimum boiling point is preferably used for a saturation temperature of heat generation temperature of the imaging device 12a.

A heat coupling portion 198 is provided in the first radiation member 180. The heat coupling portion 198 is inserted into the insertion hole 40 made in the FPC board 22, and is thermally coupled to the apparatus chassis 176. Therefore, the first radiation member 180 can discharge the heat transferred from the FPC board 22 including the imaging device 12a by transferring the heat to the apparatus chassis 176 through the heat coupling portion 198.

The first and second radiation members 180 and 184 and the metal plate 190 are made of the same material.

Figure 8:
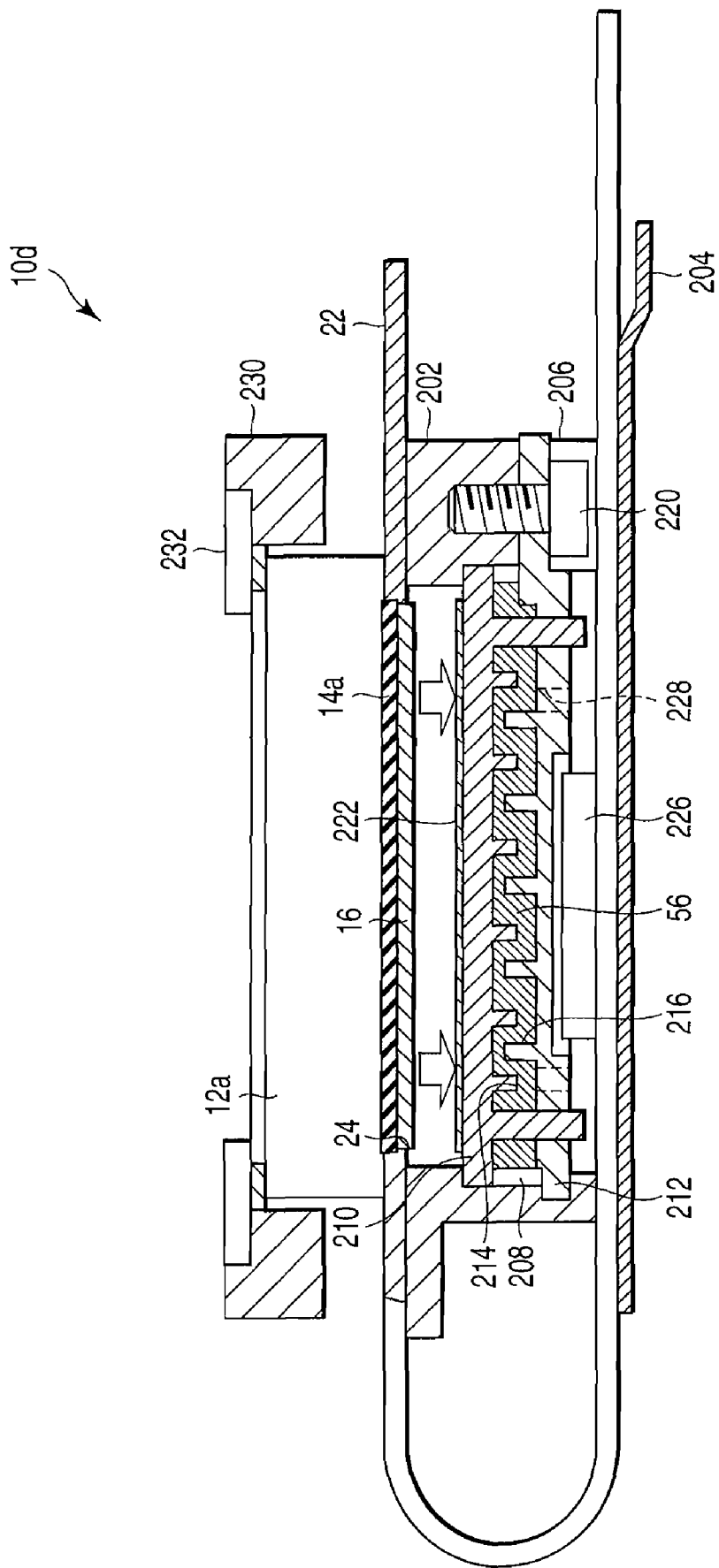
FIG. 8 is a sectional view showing another example of the imaging device module according to the first embodiment of the invention.
Figure 9:
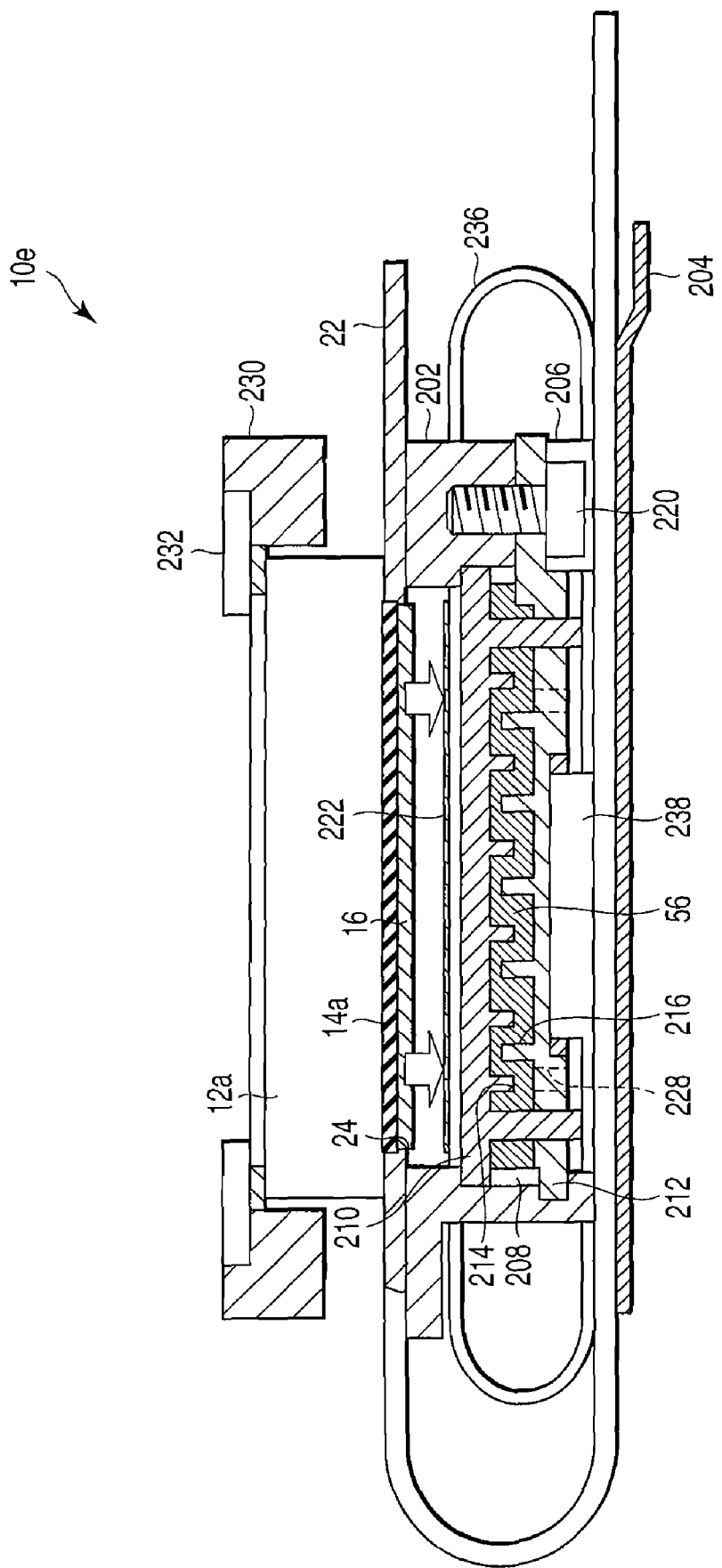
FIG. 9 is a sectional view showing another example of the imaging device module according to the first embodiment of the invention.

FIGS. 8 and 9 show part of the present invention, using FIG. 3 of Japanese Patent Application No. 2007-315010 filed by the applicant of the present application.

The imaging device 12a of the imaging unit shown in FIGS. 8 and 9 is supported by a first moving frame of a camera-blur preventing mechanism driven in two-dimensional directions (X and Y directions) on a plane orthogonal to the optical axis of the imaging lens, and a second moving frame, that is, a moving frame 230 shown in FIGS. 8 and 9. The imaging device 12a of the imaging unit is driven by a drive portion to be described later in a direction to compensate the blurring in the two-dimensional directions on the plane orthogonal to the optical axis of the imaging lens when blurring is detected.

The camera-blur preventing mechanism includes a base fixed to a camera main body (not shown), the first moving frame driven in a Y direction relative to the base, the second moving frame driven in a X direction relative to the first moving frame, an imaging unit supported by the second moving frame, a first driving mechanism portion mounted on the base and including a first electromagnetic driving source and a driving mechanism to move the first moving frame in the Y direction, a second driving mechanism portion mounted on the base and including a second electromagnetic driving source and a driving mechanism to move the second moving frame in the X direction, and an FPC (flexible printed circuit board) connecting the imaging unit and a control portion on the camera side.

The imaging device module 10d (applied to the single-lens reflex digital camera with the image stabilizing function similar to that of FIG. 7) shown in FIG. 8 is configured using the bear chip imaging device 12a.

Referring to FIG. 8, in the FPC board 22, the opening 24 is formed opposite the insulating sheet 14a of the imaging device 12a. The heat reflection member 16 having the processed surface whose emissivity is 0.1 or less is coupled to the opening 24.

The FPC board 22 is placed on and thermally coupled to the first radiation member 202 constituting a board holding portion made of a metal material such as copper. While the FPC board 22 is held by the first radiation member 202, the FPC board 22 is folded so as to wrap around the first radiation member 202, and the FPC board 22 is engaged and positioned along a pressing member 204 made of a metal material such as copper. A projection 206 is formed in the pressing member 204. The projection 206 is inserted into the FPC board 22, and the projection 206 is brought into surface contact with the first radiation member 202 to establish the thermal coupling.

The first radiation member 202 is formed in a cylindrical shape in which the opening 24 of the FPC board 202 can be accommodated, and a guide groove 208 is provided in an inner wall portion of the first radiation member 202. A second radiation member 210 and a third radiation member 212, made of a metal material, are movably accommodated in the guide groove 208. The second radiation member 210 and the third radiation member 212 are coupled to each other while sandwiching the thermal conductive material 56 formed by the silicon gel or graphite sheet therebetween.

Radiation fins 214 and 216 are provided on surfaces facing each other in the second and third radiation members 210 and 212. The radiation fins 214 and 216 are thermally coupled to each other through the thermal conductive material 56. In the second and third radiation members 210 and 212, for example, a part of the third radiation member 212 is fixed to the first radiation member 202 using a screw member 220 and accommodated and disposed in the first radiation member 202. A high-radiation sheet 222 is coupled to the surface facing the heat reflection member 16 above the second radiation member 210.

A temperature sensor 226 is mounted on the FPC board 22. The temperature sensor 226 detects the temperature in the first radiation member 202. The temperature sensor 226 detects ambient temperature in the first radiation member 202 to output the detected temperature to a control portion (not shown). When the control portion detects that the first radiation member 202 has the detected temperature not lower than a predetermined temperature for at least a predetermined time based on a detection signal from the temperature sensor 226, the control portion generates a danger signal and displays a warning such as operation stop on a display portion (not shown).

A pressing member 232 engages a surrounding portion of the imaging surface of the imaging device 12a, and the pressing member 232 is supported by a moving frame 230 constituting a well-known image stabilizing mechanism. The imaging device 12a is moved in a two-dimensional manner through the moving frame 230 while a surface direction of the imaging device 12a is kept constant, thereby enabling the so-called image stabilizing function. The moving frame 230 is thermally coupled to the pressing member 204 through coupling means (not shown). The heat generated by driving of the moving frame 230 is transferred to the pressing member 204 and first radiation member 202 through the coupling means, and the heat is discharged.

In FIG. 8, a vent hole 228 is made in the third radiation member 212. The vent hole 228 is used to discharge the air in the thermal conductive material 56, when the second radiation member 210 and the third radiation member 212 are coupled while the thermal conductive material 56 is interposed.

In the embodiment, a better heat transfer property can be obtained when the high-radiation sheet 50 having the processed surface having the low infrared reflectance and high heat absorbing property is disposed opposite the heat reflection member 16 in the other surface of the second radiation member 210.

In the imaging device module 10e shown in FIG. 9, a well-known wick-type heat pipe 236 is assembled to and thermally coupled to the first and second radiation members 210 and 212 of FIG. 8, and the heat pipe 236 accepts the infrared ray radiated from the heat reflection member 16, thermally coupled to the insulating sheet 14a of the imaging device 12a, through the opening 24 of the FPC board 22. In FIG. 9, the same components as those of FIG. 8 are designated by the same reference numerals, and the detailed description thereof is omitted.

Figure 10:
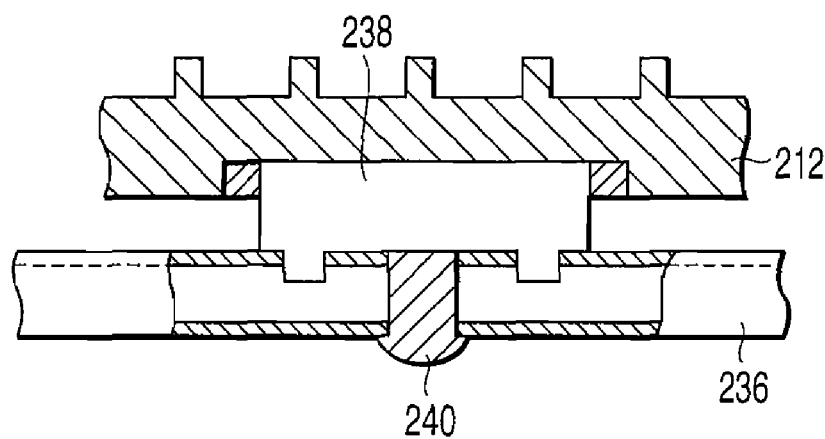
FIG. 10 is a partial sectional view showing an enlarged main part of FIG. 9.

The heat pipe 236 is formed by a circulating path in which the working fluid is stored. As shown in FIG. 10 which is a partial sectional view showing an enlarged main part of FIG. 9, a well-known piezoelectric pump 238 disclosed in Jpn. Pat. Appln. KOKAI Publication No. 2003-28068 is connected to an intermediate portion of the heat pipe 236 while a sealing valve 240 is interposed. The piezoelectric pump 238 is mounted on the FPC board 22. When the sealing valve 240 is driven and controlled by a control portion (not shown), the working fluid is circularly supplied to accept the heat radiated from the heat reflection member 16, and the working fluid transfers the heat to the first and second radiation members 210 and 212 to realize the radiation.

In the case where the imaging device module 10e is used for the electronic camera, the control portion (not shown) drives the piezoelectric pump 238 when a user switches imaging modes, or when the temperature near the imaging device 12a becomes a predetermined temperature or more in starting up the power supply operation. When the piezoelectric pump 238 is driven, the working fluid is circulated in the heat pipe 236 to transfer the heat to the second radiation member 210, the thermal conductive material 56, and the third radiation member 212, which suppresses the temperature rise near the imaging device 12a.

As to a loop shape of the heat pipe 236, for example, the intermediate portion on the left side of FIG. 9 may be curved while both end portions are formed in flat. Therefore, because a space margin is ensured, the assembling of a bearing assembled to a guide shaft for guiding the movement of the moving frame 230 can be simplified.

In the embodiment, when the high-radiation sheet 50 is provided opposite the heat reflection member 16 of the heat pipe 236, the better effect can be obtained.

Figure 11:
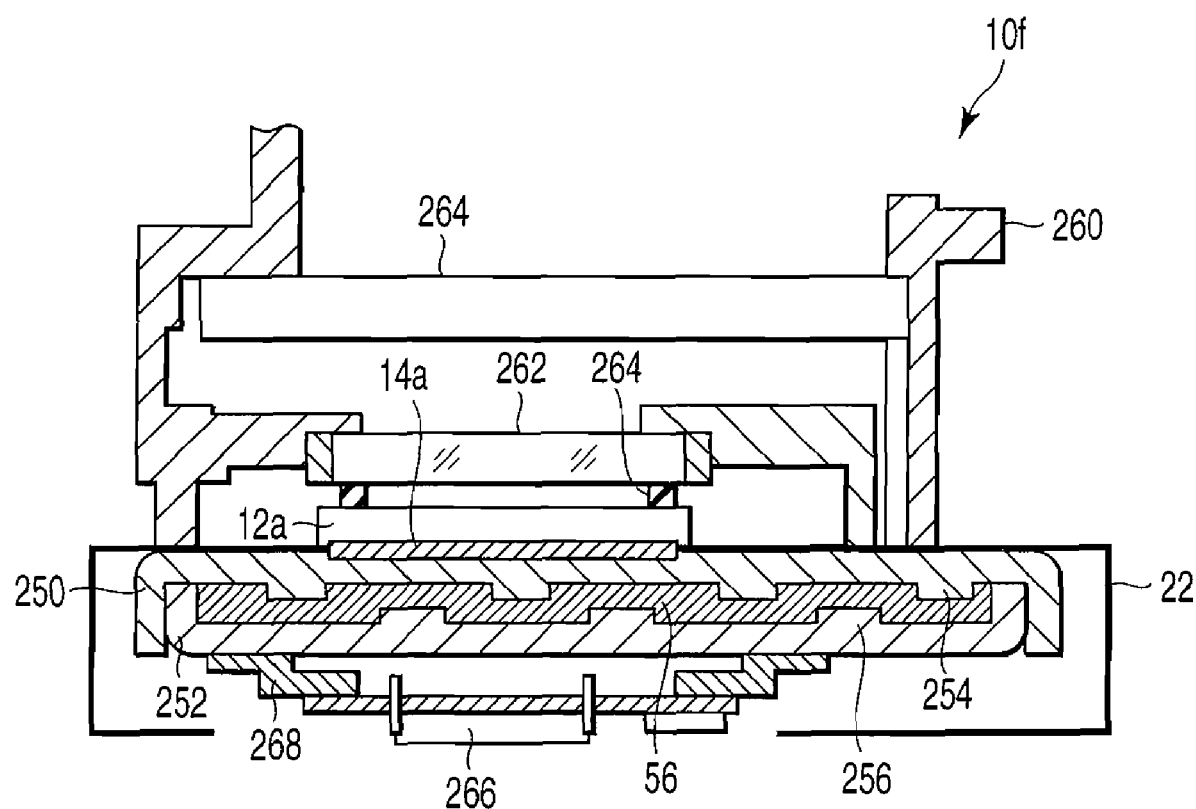
FIG. 11 is a sectional view showing another example of the imaging device module according to the first embodiment of the invention.

The imaging device module 10f shown in FIG. 11 is formed using the bear chip imaging device 12a.

Referring to FIG. 11, the imaging device 12a is mounted on the FPC board 22 while the insulating sheet 14a of the imaging device 12a faces the board surface. In the FPC board 22, the opening 24 is provided opposite the insulating sheet 14a, and the surrounding portion including the insulating sheet 14a is laminated on and thermally coupled to the outer surface wall of a recessed first radiation member 250 made of a metal material such as copper.

A recessed second radiation member 252 made of the same material as the first radiation member 250 is coupled to the first radiation member 250 while opening sides of the first and second radiation members 250 and 252 face each other. The second radiation member 252 accommodates the thermal conductive material 56 such as the silicon gel and graphite sheet having the excellent thermal conductivity. Radiation fins 254 and 256 are provided on inner walls of the first and second radiation members 250 and 252. The radiation fins 254 and 256 are coupled to each other while the thermal conductive material 56 is buried between the radiation fins 254 and 256.

The first radiation member 250 is supported by a support frame member 260, and is thermally coupled to the apparatus chassis (not shown) while the support frame member 260 is interposed. A lowpass filter 262 and a shutter 264 are sequentially assembled to the support frame member 260 while facing the element surface of the imaging device 12a. A ring rubber member 264 is interposed between the imaging device 12a and the lowpass filter 262 to prevent the dust from invading into the surface of the lowpass filter 262.

An electronic component 266 such as a central processing unit (CPU) mounted on the FPC board 22 is thermally coupled to the second radiation member 252 while a support plate 268 is interposed. Therefore, the heat generated by driving the electronic component 266 mounted on the FPC board 22 is transferred to the second radiation member 252 through the support plate 268.

At this point, the heat is transferred to the first and second radiation members 250 and 252 from the imaging device 12a and the electronic component 266. Then, the first and second radiation members 250 and 252 are efficiently conducted to each other through the radiation fins 254 and 256 and thermal conductive material 56 and set to a uniform temperature, and the heat can efficiently be radiated through the support frame member 260.

Figure 12:
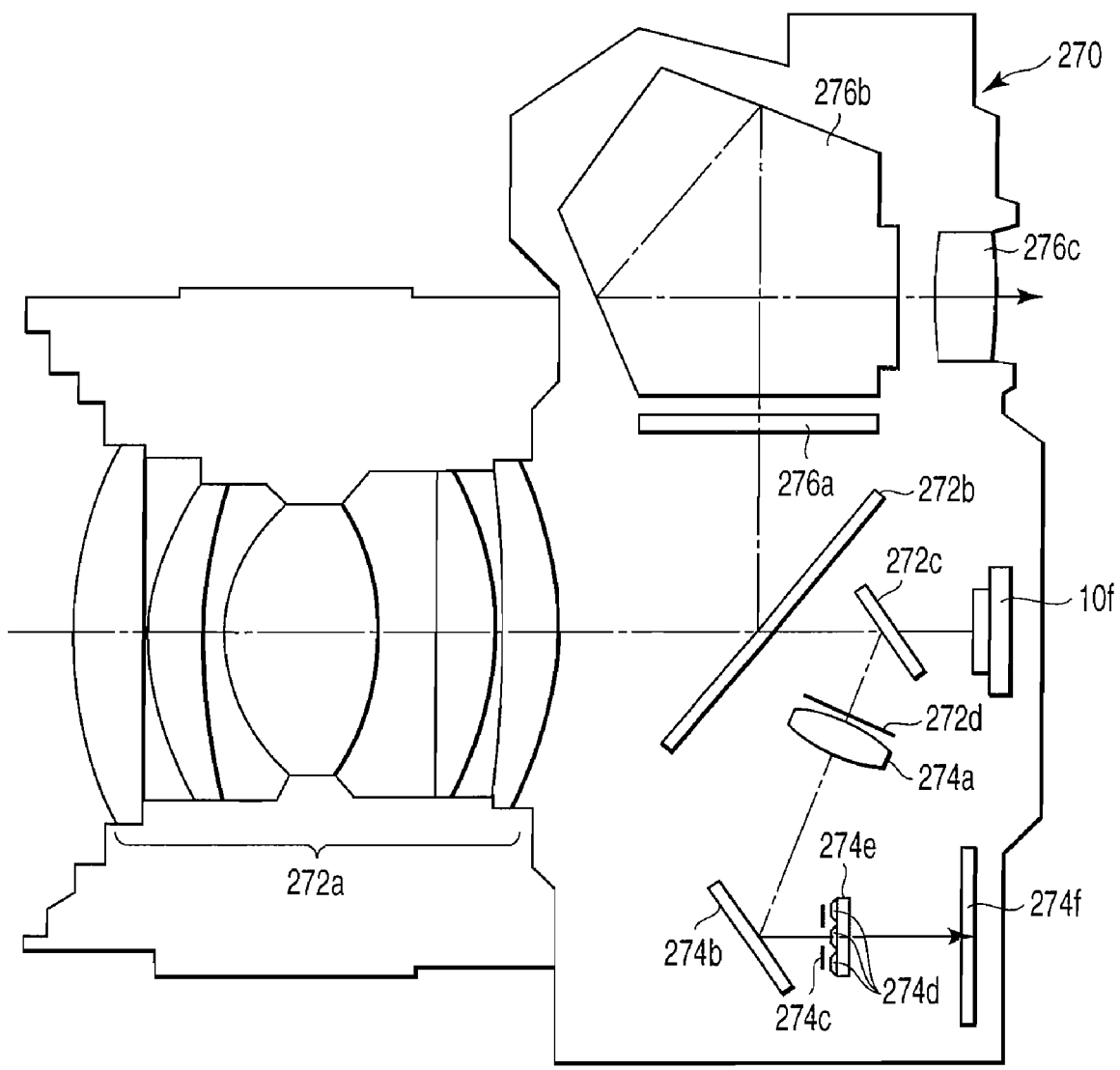
FIG. 12 is a schematic view showing a configuration of a single-lens reflex electronic camera in which the imaging device module according to the first embodiment of the invention is used.

The imaging device module 10f of FIG. 11 is used while incorporated into a camera main body 270 which is a camera chassis of a single-lens reflex electronic camera of FIG. 12 constituting the portable electronic apparatus.

In the single-lens reflex electronic camera, an imaging optical system, a viewfinder optical system and a focus detecting optical system are disposed in the camera main body 270. The imaging optical system includes an imaging lens group 272a, a half mirror 272b, and a reflecting mirror 272c in the order of the optical path.

The imaging lens group 272a is detachably assembled to the camera main body 270 while a mount is interposed. The half mirror 272b divides the optical path from the imaging lens group 272a into the direction of the imaging device module 10f and the viewfinder optical system. The half mirror 272b is formed by a quick return mirror which is retractable from the imaging optical path in conjunction with the shutter 264.

The reflecting mirror 272c guides the light from the imaging lens group 272a to the focus detecting optical system. The reflecting mirror 272c is retractable from the imaging optical path in conjunction with the half mirror 272b. When the reflecting mirror 272c is retracted from the imaging optical path, the light from the imaging lens group 272a is guided to the imaging device module 10f, and the optical path from the imaging lens group 272a is switched between the direction of the imaging device module and the focus detecting optical system.

The focus detecting optical system includes a condenser lens 274a, a reflecting mirror 274b, an aperture diaphragm group 274c, a re-imaging optical system 274e, and a photoelectric conversion element line 274f. The condenser lens 274a is disposed near a projected imaging surface 272d equal to an imaging surface of the imaging lens group 272a. The reflecting mirror 274b is used to fold the light from the condenser lens 274a to accommodate the light in the compact camera main body 270. The aperture diaphragm group 274c has pairs of aperture diaphragms in vertical and horizontal directions respectively. In the re-imaging optical system 274e, a pair of re-imaging lenses 274d is integrally combined with the pair of aperture diaphragms 274c.

In the combination of the pair of aperture diaphragms 274c and the corresponding pair of re-imaging lenses 274d, the center of each aperture diaphragm 274c and the corresponding re-imaging lens 274d are eccentric from the optical axis of the imaging lens group 272a.

On the optical path in the direction in which the light is reflected by the half mirror 272b, the viewfinder optical system includes a screen 276a, a pentagonal prism 276b, and an ocular lens 276c. The screen 276a is disposed in the projected imaging surface equal to the imaging surface of the imaging lens group 272a.

The dust-proof mechanism 100 shown in FIG. 4 is disposed and accommodated between the lowpass filter 262 and the shutter 264. That is, the attaching member 104 is fixed to the support frame member 260 using the screw member 110 and the attaching member 104 is disposed and accommodated between the lowpass filter 262 and the shutter 264. Therefore, the vibration is transmitted to the transparent glass board 114 in conjunction with the vibration generating member 120, and the dust adhering to the surface of the transparent glass board 114 is removed by the vibration and prevented from invading into the lowpass filter 262.

In the embodiment, the imaging device modules $10_1$, 10, and 10a to 10f are incorporated into the camera unit and single-lens reflex electronic camera. The invention is not limited to the embodiment. For example, the similar effect can be obtained when the imaging device module is incorporated into a portable electronic apparatus including a portable terminal such as a mobile telephone.

Second Embodiment

A second embodiment of the invention will be described below with reference to FIG. 13.

Figure 13:
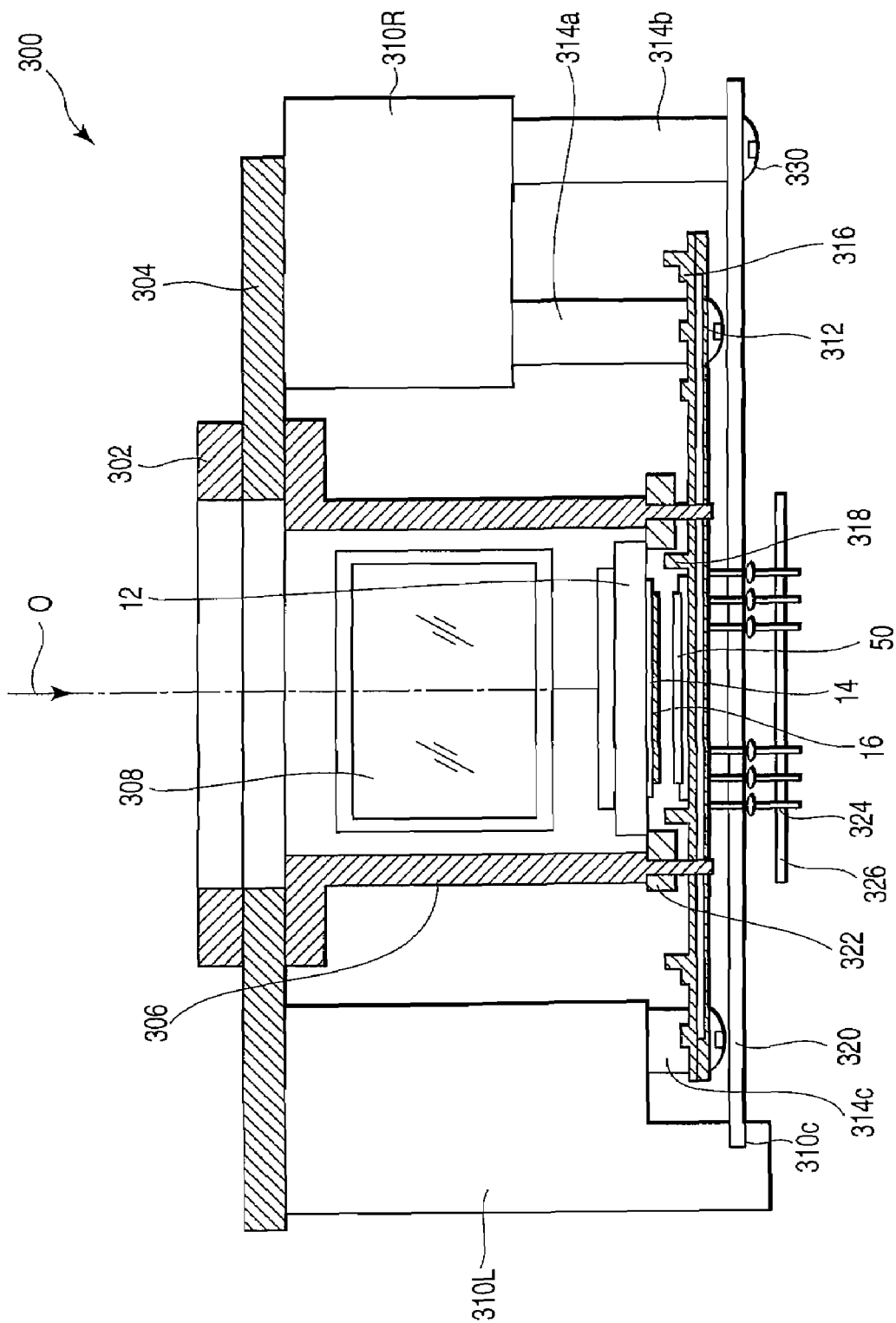
FIG. 13 is a horizontal sectional view showing a configuration example in the neighborhood of a mirror/imaging device unit according to a second embodiment of the invention.

FIG. 13 is a horizontal sectional view showing a configuration example in the neighborhood of a mirror/imaging device unit according to the second embodiment of the invention.

A mirror/imaging device unit 300 of the second embodiment is a unit which is applied to the single-lens reflex digital camera and supported by the frame main body of the camera body (not shown).

Referring to FIG. 13, the mirror/imaging device unit 300 includes a body-side mount 302, a front frame 304, a mirror box 306, a quick return mirror 308, the imaging device 12, and a rear frame 312. An imaging lens (not shown) is exchangeably attached to the body-side mount 302. The body-side mount 302 is attached to the front frame 304. The quick return mirror 308 is rotatably accommodated in the mirror box 30. The rear frame 312 is a radiation plate firmly bonded to the backsides of side frames 310L and 310R.

The front frame 304 has a central opening. The body-side mount 302 is firmly bonded onto the front surface side of the central opening, the mirror box 306 is firmly bonded in the center of the rear surface side of the front frame 304, and a rear surface portion of the front frame 304 is supported by the side frames 310L and 310R of the frame main body.

The rear frame 312 is formed by a stainless-steel plate or an aluminum plate. The rear frame 312 is disposed across a rear end portion of the mirror box 306, and the rear frame 312 is firmly bonded to the side frames 310L and 310R while support posts 314c and 314a are interposed respectively. The support posts 314a and 314c constitute a heat insulating member for blocking the transfer of the heat generated in the imaging device 12 from the rear frame 312 to the side frames 310L and 310R. In the rear frame 312, radiation fins 316 coupled to the high-radiation sheet 50 are disposed outward to improve the heat radiation effect. The radiation fins 316 are located at the position where the radiation fins 316 face the heat reflection member 16. The rear frame 312 is screwed to the side frames 310L and 310R by utilizing predetermined insertion holes in many insertion holes made in the rear frame 312.

As described above, the front frame 304, the side frames 310L and 310R, and the rear frame 312 are sequentially fixed and integrated to form the hollow box-shaped frame main body in accordance with an outer shape of the camera.

The right side frame 310R is formed thinner than the left side frame 310L. Therefore, the support post 314a formed by the heat insulating member is extended rearward from the backside of the side frame 310R so as to cover the lack of the thickness. The rear frame 312 is fixed by engaging screws in screw holes at front ends of the support post 314a and support post 314c vertically provided in the side frame 310L. The longer support post 314b extended in parallel with the support post 314a is used to insert a circuit board 320 at the back of the rear frame 312 into a collar portion formed at a front end of the side frame 310L to fix the circuit board 320 to the side frame 310R.

The mirror box 306 is formed in a box shape having a central opening, and is attached to the front frame 304 at a front-surface flange portion. The rotatable quick return mirror 308 is disposed in the central opening and a screen (not shown) is disposed above the opening. The imaging device 12 is fixed to the rear portion of the mirror box 306 while an imaging device support plate 322 is interposed. A temperature sensor (not shown) is disposed near the imaging device 12 to detect a temperature near the imaging device 12.

The heat reflection member 50 is coupled to the insulating sheet 14 in the backside of the imaging device 12. The imaging device support plate 322 is attached to the mirror box 306 by engaging a screw, inserted into an insertion hole, in a screw hole in the backside of the mirror box 306.

A positioning pin which is a stopper is formed in the backside of the mirror box 306, and the positioning pins are inserted into the insertion holes of the imaging device support plate 322 and rear frame 312. The positioning pin is inserted in the positioning hole of the rear frame 312 while a sufficient gap remains, i.e. the positioning pin is in a loose-fit state, and the mirror box 306 is not directly fixed to the rear frame 312.

The fitting between the positioning pin and the positioning hole of the rear frame 312 is configured such that a gap exists between the positioning pin and the positioning hole in consideration of a dimension error of a diameter of the positioning pin in the mirror box 306, a dimension error of a position in the mirror box 306, a dimension error of an outer diameter of the positioning hole in the rear frame 312, and a dimension error of a position of the positioning hole in the rear frame 312. When the frame main body is largely deformed, the one-side gap is decreased, which prevents the further deformation.

The imaging device 12 is disposed in the opening in the backside of the mirror box 306, bonded to the front surface of the imaging device support plate 322, and disposed so as to be surrounded by the frame main body. The imaging device 12 has a pair of leads (connection terminals) 324 above and below the imaging device 12, and the leads 324 are extended toward the direction of the optical axis O. The leads 324 of the imaging device 12 are loosely inserted into a long hole (clearance hole) of the imaging device support plate 322, a circular clearance hole of the rear frame 312, and a long hole (clearance hole) of the circuit board 320. The leads 324 are fixed to flexible printed boards 326 on the circuit board 320, and the imaging device 12 and the circuit board 320 are electrically connected by the pair of flexible printed boards 326.

The circuit board 320 is inserted into a pawl portion 310a provided in the side frame 310L, and is supported by the support post 314b and fixed with a small screw 330. The pair of flexible printed boards 326 has plural insertion holes having surrounding conductive patterns. The lead 324 of the imaging device 12 can be inserted into the insertion hole. The pair of flexible printed boards 326 also has plural connection patterns which are electrically connected to the conductive pattern and connected to connection patterns on the circuit board 320.

To diffuse heat with the radiation fins 316 and the rear frame 312 shown in FIG. 13, a heat diffusion plate made of metal having high thermal conductivity is arranged in a position separated from the rear surface of the package made of metal or synthetic resin, though not shown in the drawings. The heat diffusion plate is connected to at least one of the heat radiating fins 316 and the rear frame 312 by a copper wire or plate, so that the heat radiating effect can be increased.

The invention is not limited to the above embodiments, but various modifications can be made without departing from the scope of the invention. In the first and second embodiments, the lens-exchangeable single-lens reflex digital camera is used as the electronic camera. However, the invention is not limited to the single-lens reflex digital camera, but the invention can be applied to the compact digital camera.

Therefore, the invention is not limited to the embodiments, but various modifications can be made without departing from the scope of the invention. The embodiments include inventions at various stages, but various inventions can be extracted by an appropriate combination in the disclosed plural constituents.

Even if some constituents are deleted from all the constituents shown in the embodiment, the problem of the invention can be solved, and the configuration in which some constituents are deleted can be extracted as the invention in the case where the effect of the invention is obtained.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An imaging device module comprising:
    a printed circuit board which is accommodated in an apparatus chassis and provided with an opening;
    an imaging device which is mounted on the printed circuit board while an insulating sheet faces the opening in the printed circuit board;
    an infrared reflection member which is disposed while thermally coupled to a backside of the imaging device, and reflects an infrared ray emitted from a radiation plate; and
    a radiation member which is thermally coupled to the apparatus chassis and disposed opposite the infrared reflection member.

2. The imaging device module according to claim 1, wherein a latent heat accumulation material is encapsulated in the radiation member or connected to the heat radiation member.

3. The imaging device module according to claim 1, wherein radiation fins are provided on the radiation member.

4. The imaging device module according to claim 1, wherein an infrared absorbing material is disposed opposite the infrared reflection member in the radiation member.

5. The imaging device module according to claim 1, wherein the radiation member is formed by first and second radiation members,
    the first radiation member is thermally coupled to at least one of a package and the printed circuit board, the imaging device being accommodated in the package, and a thermal conductive material having excellent thermal conductivity is disposed between the first radiation member and the second radiation member.

6. The imaging device module according to claim 5, wherein radiation fins are formed on inner walls and outer walls in the first and second radiation members, the thermal conductive material or the latent heat accumulation material being disposed in the inner walls and outer walls.

7. The imaging device module according to claim 5, wherein the first and second radiation members are coupled by caulking while the thermal conductive material or the latent heat accumulation material is interposed.

8. The imaging device module according to claim 6, wherein the first and second radiation members are coupled by caulking while the thermal conductive material or the latent heat accumulation material is interposed.

9. The imaging device module according to claim 1, wherein a plurality of projections are provided in the radiation member while inserted into the printed circuit board, the projections facing a sidewall of a connection terminal of the imaging device.

10. The imaging device module according to claim 4, wherein the radiation member is coupled to a heat absorbing surface of a heat pipe through which a working fluid is circulated to the infrared absorbing material.

11. An imaging device module comprising:
an imaging device which is disposed while an insulating sheet is exposed to a surface side opposite to a mounting surface;
a flexible printed circuit board which is accommodated in an apparatus chassis, an electronic component including the imaging device being mounted on the flexible printed circuit board;
a radiation member which is thermally coupled to the apparatus chassis, and partially supports a backside of the flexible printed circuit board in a neighborhood of the imaging device while thermally coupled to the insulating sheet of the imaging device;
a thermal conductive material which is encapsulated in the radiation member and has excellent thermal conductivity compared with the radiation member; and
a support member which is thermally coupled to the radiation member, and partially supports the backside of the flexible printed circuit board in a neighborhood of the electronic component.

12. The imaging device module according to claim 11, wherein a latent heat accumulation material is encapsulated in the radiation member or connected to the heat radiation member.

13. A portable electronic apparatus in which an imaging device module is used, the portable electronic apparatus comprising:
an apparatus chassis; and
an imaging device module which is disposed and accommodated in the apparatus chassis, a package-type imaging device being mounted on a printed circuit board in the imaging device module, a heat acceptance portion being disposed while thermally coupled to a backside of the imaging device in the imaging device module, a radiation member being disposed opposite the heat acceptance portion in the imaging device module while being thermally coupled to the apparatus chassis.

14. The portable electronic apparatus according to claim 13, wherein the apparatus chassis is a camera chassis.

15. A portable electronic apparatus in which an imaging device module is used, the portable electronic apparatus comprising:
an apparatus chassis; and
an imaging device module which is disposed and accommodated in the apparatus chassis, an electronic component including an imaging device being connected to a flexible printed circuit board, a radiation member which is thermally coupled to the apparatus chassis being thermally coupled to the insulating sheet of the imaging device while abutting on the insulating sheet, a thermal conductive material having excellent thermal conductivity being encapsulated in the radiation member, the radiation member partially supporting a backside of the flexible printed circuit board in a neighborhood of the imaging device, the radiation member partially supporting the backside of the flexible printed circuit board in a neighborhood of the electronic component while a support member thermally coupled to the radiation member is interposed.

16. The portable electronic apparatus according to claim 15, wherein the apparatus chassis is a camera chassis.

17. The imaging device module according to claim 11, further comprising a lens unit which has a linear screw mechanism comprising a stepping motor provided with a space margin through which an optical axis of a lens passes.

18. The portable electronic apparatus according to claim 13 using the imaging device module, further comprising a lens unit which has a linear screw mechanism comprising a stepping motor provided with a space margin through which an optical axis of a lens passes.

19. The portable electronic apparatus according to claim 15 using the imaging device module, further comprising a lens unit which has a linear screw mechanism comprising a stepping motor provided with a space margin through which an optical axis of a lens passes.

* * * * *